United States Patent
Ma (10) Patent No.: US 10,528,169 B2
(45) Date of Patent: Jan. 7, 2020

(54) PIXEL CIRCUIT AND DRIVING METHOD THEREOF, DISPLAY MODULE AND DRIVING METHOD THEREOF, AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 52 days.

(21) Appl. No.: 15/959,922

(22) Filed: Apr. 23, 2018

(65) Prior Publication Data

US 2019/0004650 A1 Jan. 3, 2019

(30) Foreign Application Priority Data

Jun. 28, 2017 (CN) .......................... 2017 1 0505820

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/042* (2013.01); *G06F 3/044* (2013.01); *G06F 3/0416* (2013.01); *G09G 3/3225* (2013.01); *G09G 3/3233* (2013.01); *G09G 3/3275* (2013.01); *H01L 27/323* (2013.01); *H01L 27/3262* (2013.01); *H01L 27/3265* (2013.01); *G09G 2320/045* (2013.01)

(58) Field of Classification Search
CPC ...... G06F 3/0412; G06F 3/0416; G06F 3/042; G06F 3/044; G09G 3/3225; G09G 3/3233; G09G 3/3275; G09G 2320/045; H01L 27/323; H01L 27/3262; H01L 27/3265

See application file for complete search history.

(56) References Cited

U.S. PATENT DOCUMENTS

2014/0098064 A1 4/2014 Lien et al.
2017/0031485 A1* 2/2017 Kim ...................... G06F 3/0412

FOREIGN PATENT DOCUMENTS

CN 102830859 A 12/2012
CN 103218085 A 7/2013
CN 104392699 A * 3/2015 ........... G06F 3/0412

* cited by examiner

*Primary Examiner* — Mark Edwards
(74) *Attorney, Agent, or Firm* — Westman, Champlin & Koehler, P.A.

(57) ABSTRACT

The present disclosure provides a pixel circuit, a driving method thereof, a display module, a driving method thereof and a display device. The pixel circuit includes a touch pixel driving sub-circuit. The touch pixel driving sub-circuit includes a pixel driving circuit, a control circuit and a photosensitive touch circuit. The photosensitive touch circuit outputs a touch sensing current signal. The pixel driving circuit is configured to extract a threshold voltage signal of a driving transistor, and output the threshold voltage signal. The control circuit is configured to control whether or not a touch sensing current signal output end is to be electrically connected to a touch display signal line under the control of a touch reading control end, and control whether or not a compensation signal output end is to be electrically connected to the touch display signal line under the control of a display compensation control end.

20 Claims, 3 Drawing Sheets

(51) Int. Cl.
*G09G 3/3225* (2016.01)
*G06F 3/044* (2006.01)
*G09G 3/3233* (2016.01)
*G09G 3/3275* (2016.01)
*G06F 3/042* (2006.01)

PIXEL CIRCUIT AND DRIVING METHOD THEREOF, DISPLAY MODULE AND DRIVING METHOD THEREOF, AND DISPLAY DEVICE

CROSS-REFERENCE TO RELATED APPLICATION

The present application claims a priority of the Chinese patent application No. 201710505820.X filed on Jun. 28, 2017, which is incorporated herein by reference in its entirety.

TECHNICAL FIELD

The present disclosure relates to the field of display technology, in particular to a pixel circuit and a driving method thereof, a display module and a driving method thereof, and a display device.

BACKGROUND

For a conventional Active-Matrix Organic Light-Emitting Diode (AMOLED) display device, an On-Cell capacitive touch mode is adopted. To be specific, two separate manufacture processes are adopted, i.e., a processor for manufacturing a capacitive touch substrate, and a processor for manufacturing an OLED display substrate. In addition, currently the number of capacitive touch circuits is smaller than the number of pixel units, so it is impossible to achieve fingerprint identification with high precision.

SUMMARY

A main object of the present disclosure is to provide a pixel circuit, a driving method thereof, a display module, a driving method thereof, and a display device, so as to reduce the process complexity and improve the precision as compared with the related art where an On-Cell capacitive touch mode is used for the AMOLED display device.

In one aspect, the present disclosure provides in some embodiments a pixel circuit, including a touch pixel driving sub-circuit and a light-emitting element. The touch pixel driving sub-circuit includes a pixel driving circuit connected to the light-emitting element. The pixel driving circuit is connected to an external source electrode driver via a corresponding data line. The touch pixel driving sub-circuit further includes a control circuit and a photosensitive touch circuit. The photosensitive touch circuit is configured to generate a corresponding touch sensing current signal in accordance with a received light intensity signal, and output the touch sensing current signal via a touch sensing current signal output end. The pixel driving circuit is configured to extract a threshold voltage signal of a driving transistor, and output the threshold voltage signal via a compensation signal output end. The control circuit is connected to the compensation signal output end of the pixel driving circuit, the touch sensing current signal output end of the photosensitive touch circuit, a display compensation control end, a touch reading control end and a touch display signal line, and configured to control whether or not the touch sensing current signal output end is to be electrically connected to the touch display signal line under the control of the touch reading control end, and control whether or not the compensation signal output end is to be electrically connected to the touch display signal line under the control of the display compensation control end.

In a possible embodiment of the present disclosure, the control circuit includes a display compensation control module and a touch reading control module. The display compensation control module is connected to the compensation signal output end, the display compensation control end and the touch display signal line, and configured to control the compensation signal output end to be electrically connected to the touch display signal line at a display compensation stage and control the compensation signal output end not to be electrically connected to the touch display signal line at a display stage under the control of the display compensation control end. The touch reading control module is connected to the touch sensing current signal output end, the touch reading control end and the touch display signal line, and configured to control the touch sensing current signal output end not to be electrically connected to the touch display signal line at the display compensation stage and control the touch sensing current signal output end to be electrically connected to the touch display signal line at the display stage under the control of the touch reading control end.

In a possible embodiment of the present disclosure, the display compensation control module includes a display compensation control transistor, a gate electrode of which is connected to the display compensation control end, a first electrode of which is connected to the touch display signal line, and a second electrode of which is connected to the compensation signal output end. The touch reading control module includes a touch reading control transistor, a gate electrode of which is connected to the touch reading control end, a first electrode of which is connected to the touch sensing current signal output end, and a second electrode of which is connected to the touch display signal line.

In a possible embodiment of the present disclosure, the photosensitive touch circuit includes a photosensitive transistor, a touch capacitor circuit and a touch transistor. A gate electrode of the photosensitive transistor is connected to a photosensitive resetting control end, a first electrode thereof is connected to a first end of a touch capacitor circuit, and a second electrode of which is connected to a photosensitive resetting signal input end. A second end of the touch capacitor circuit is connected to a first level input end. A gate electrode of the touch transistor is connected to the first electrode of the photosensitive transistor, a first electrode thereof is connected to the first level input end, and a second electrode thereof is connected to the touch sensing current signal output end.

In a possible embodiment of the present disclosure, the pixel driving circuit includes the driving transistor, a display capacitor circuit, a data write-in circuit and a light-emission control circuit. A first end of the display capacitor circuit is connected to a gate electrode of the driving transistor, and a second end thereof is connected to a first electrode of the driving transistor. A second electrode of the driving transistor is connected to the compensation signal output end. The data write-in circuit is connected to the gate electrode of the driving transistor, a corresponding gate line and a corresponding data line, and configured to control whether or not the gate electrode of the driving transistor is to be electrically connected to the corresponding data line under the control of the corresponding gate line. The light-emission control circuit is connected to a light-emission control end, the light-emitting element and the second electrode of the driving transistor, and configured to control whether or not the second electrode of the driving transistor is to be electrically connected to the light-emitting element under the control of the light-emission control end.

In a possible embodiment of the present disclosure, the data write-in circuit includes a data write-in transistor, and the light-emission control circuit includes a light-emission control transistor. A gate electrode of the data write-in transistor is connected to the corresponding gate line, a first electrode thereof is connected to the gate electrode of the driving transistor, and a second electrode thereof is connected to the corresponding data line. A gate electrode of the light-emission control transistor is connected to the light-emission control end, a first electrode thereof is connected to the light-emitting element, and a second electrode thereof is connected to the second electrode of the driving transistor.

In another aspect, the present disclosure provides in some embodiments a method for driving the above-mentioned pixel circuit. The pixel circuit is included in a display module, and the display module includes pixel circuits arranged in M rows, where M is a positive integer greater than 1. Each display period includes a display compensation stage and a display stage. Each display stage includes M touch sensing signal reading sub-stages. In the case that the pixel circuit is located in an $m^{th}$ row, the method includes steps of: at the display compensation stage within each display period, generating, by a photosensitive touch circuit, a corresponding touch sensing voltage in accordance with a received light intensity signal, and controlling, by a control circuit, a touch sensing current signal output end not to be electrically connected to a touch display signal line under the control of a corresponding touch reading control end; and at an $m^{th}$ touch sensing signal reading sub-stage of the display stage, converting, by the photosensitive touch circuit, the touch sensing voltage into a touch sensing current signal, controlling, by the control circuit, the touch sensing current signal output end to be electrically connected to the touch display signal line under the control of the corresponding touch reading control end, and outputting, by the photosensitive touch circuit, the touch sensing current signal to the touch display signal line via the touch sensing current signal output end, where m is a positive integer smaller than or greater than M.

In a possible embodiment of the present disclosure, the method further includes: at the display compensation stage of each display period, extracting, by a pixel driving circuit, a threshold voltage signal of a driving transistor, controlling, by the control circuit, a compensation signal output end to be electrically connected to the touch display signal line under the control of the display compensation control end, and outputting, by the pixel driving circuit, the threshold voltage signal to the touch display signal line via the compensation signal output end; and at the display stage, controlling, by the control circuit, the compensation signal output end not to be electrically connected to the touch display signal line under the control of the display compensation control end.

In a possible embodiment of the present disclosure, the display compensation stage includes a resetting sub-stage and a photosensing sub-stage. In the case that the photosensitive touch circuit includes a photosensitive transistor, a touch capacitor circuit and a touch transistor, the step of generating, by the photosensitive touch circuit, the corresponding touch sensing voltage in accordance with the received light intensity signal at the display compensation stage includes: at the resetting sub-stage, turning on the photosensitive transistor under the control of a photosensitive resetting control end, so as to write a photosensitive resetting signal into the touch capacitor circuit via a photosensitive resetting signal input end, thereby to reset a potential at a gate electrode of the touch transistor and turn on the touch transistor; and at the photosensing sub-stage, turning the photosensitive transistor under the control of the photosensitive resetting control end, so as to enable the photosensitive transistor to receive the light intensity signal to generate a photo-induced carrier and store the photo-induced carrier in the touch capacitor circuit, thereby to change a voltage applied to the gate electrode of the touch transistor, i.e., the touch sensing voltage. The step of converting, by the photosensitive touch circuit, the touch sensing voltage into the touch sensing current signal at the display stage includes, at the display stage, turning on the touch transistor under the control of the touch sensing voltage, so as to generate a touch sensing current flowing through the touch transistor.

In another aspect, the present disclosure provides in some embodiments a display module, including the above-mentioned pixel circuits arranged in M rows and N columns, and touch display signal lines arranged in N columns Control circuits of touch pixel driving sub-circuits of the pixel circuits in each row and an $n^{th}$ column are connected to an nth touch display signal line, where M is an integer greater than 1, N is an integer greater than 1, and n is a positive integer smaller than or equal to N.

In a possible embodiment of the present disclosure, the display module further includes data lines arranged in N columns, a switching circuit, a source electrode driving circuit, a touch sensing circuit and a display compensation circuit, where N is a positive integer greater than 1. The source electrode driving circuit is connected to the N data lines. The switching circuit includes N switching modules. The touch sensing circuit and the display compensation circuit are each connected to the N switching modules. An $n^{th}$ switching module includes an $n^{th}$ touch switching sub-module and an $n^{th}$ display compensation switching sub-module, where n is a positive integer smaller than or equal to N. An $n^{th}$ touch display signal line is connected to the touch sensing circuit via the nth touch switching sub-module. A control end of the nth touch switching sub-module is connected to an $n^{th}$ touch switching control end. The $n^{th}$ touch switching sub-module is configured to control whether or not the $n^{th}$ touch display signal line is to be electrically connected to the touch sensing circuit under the control of the $n^{th}$ touch switching control end. The $n^{th}$ touch display signal line is connected to the display compensation circuit via the $n^{th}$ display compensation switching sub-module. A control end of the $n^{th}$ display compensation switching sub-module is connected to an $n^{th}$ display compensation switching control end. The $n^{th}$ display compensation switching sub-module is configured to control whether or not the $n^{th}$ touch display signal line is to be electrically connected to the display compensation circuit under the control of the $n^{th}$ display compensation switching control end.

In a possible embodiment of the present disclosure, the $n^{th}$ touch switching sub-module includes an $n^{th}$ touch switching transistor, a gate electrode of which is connected to the $n^{th}$ touch switching control end, a first electrode of which is connected to the touch sensing circuit, and a second electrode of which is connected to the $n^{th}$ touch display signal line. The $n^{th}$ display compensation switching sub-module includes an $n^{th}$ display compensation switching transistor, a gate electrode of which is connected to the $n^{th}$ display compensation switching control end, a first electrode of which is connected to the display compensation circuit, and a second electrode of which is connected to the $n^{th}$ touch display signal line.

In still yet another aspect, the present disclosure provides in some embodiments a method for driving the above-mentioned display module. Each display period includes a display compensation stage and a display stage. The method includes steps of: at the display compensation of each display period, controlling, by an $n^{th}$ display compensation switching sub-module, an $n^{th}$ touch display signal line to be electrically connected to a display compensation circuit under the control of an $n^{th}$ display compensation switching control end, and controlling, by an $n^{th}$ touch switching sub-module, the nth touch display signal line not to be electrically connected to a touch sensing circuit under the control of an $n^{th}$ touch switching control end; and at the display stage, controlling, by the $n^{th}$ display compensation switching sub-module, the $n^{th}$ touch display signal line not to be electrically connected to the display compensation circuit under the control of the $n^{th}$ display compensation switching control end, and controlling, by the $n^{th}$ touch switching sub-module, the $n^{th}$ touch display signal line to be electrically connected to the touch sensing circuit under the control of the $n^{th}$ touch switching control end.

In still yet another aspect, the present disclosure provides in some embodiments a method for manufacturing the above-mentioned display module. In the case that a photosensitive touch circuit of pixel circuit included in the display module includes a photosensitive transistor, the method includes steps of: forming the photosensitive transistor at a photosensitive region of a display substrate, and forming transistors of the pixel circuit other than the photosensitive transistor at a light-emission region of the display substrate, the photosensitive region being spaced apart from the light-emission region; forming a planarization layer; and forming an anode, a pixel definition layer, an organic light-emission layer and a cathode sequentially on the planarization layer. The anode is arranged in such a manner as not to shield the photosensitive transistor and shield the transistors of the pixel circuit other than the photosensitive transistor.

In still yet another aspect, the present disclosure provides in some embodiments a display device including the above-mentioned display module.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

All transistors adopted in the embodiments of the present disclosure may be thin film transistors (TFTs), field effect transistors (FETs) or any other elements having an identical characteristic. In the embodiments of the present disclosure, in order to differentiate two electrodes other than a gate electrode from each other, one of them is called as first electrode and the other is called as second electrode. In actual use, the first electrode may be a drain electrode while the second electrode may be a source electrode, or the first electrode may be a source electrode while the second electrode may be a drain electrode.

Figure 1:
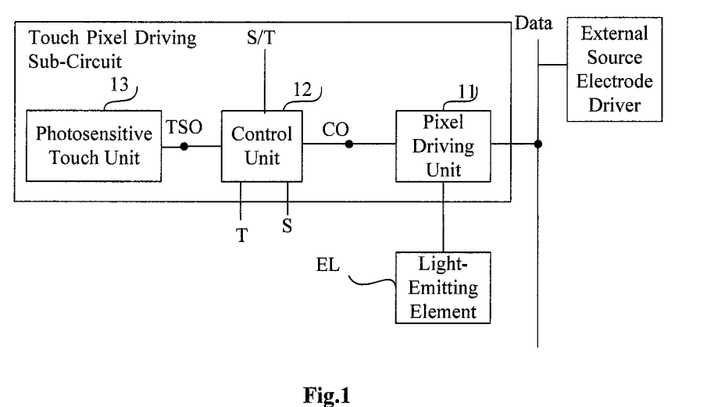
FIG. 1 is a schematic view showing a pixel circuit according to one embodiment of the present disclosure.

As shown in FIG. 1, the present disclosure provides in some embodiments a pixel circuit, including a touch pixel driving sub-circuit and a light-emitting element EL. The touch pixel driving sub-circuit includes a pixel driving circuit 11 connected to the light-emitting element. The pixel driving circuit 11 is connected to an external source electrode driver via a corresponding data line Data. The touch pixel driving sub-circuit further includes a control circuit 12 and a photosensitive touch circuit 13. The photosensitive touch circuit 13 is configured to generate a corresponding touch sensing current signal in accordance with a received light intensity signal, and output the touch sensing current signal via a touch sensing current signal output end TSO. The pixel driving circuit 11 is configured to extract a threshold voltage signal of a driving transistor, and output the threshold voltage signal via a compensation signal output end CO. The control circuit 12 is connected to the compensation signal output end CO of the pixel driving circuit 11, the touch sensing current signal output end TSO of the photosensitive touch circuit 13, a display compensation control end S, a touch reading control end T and a touch display signal line S/T, and configured to control whether or not the touch sensing current signal output end TSO is to be electrically connected to the touch display signal line S/T under the control of the touch reading control end T, and control whether or not the compensation signal output end CO is to be electrically connected to the touch display signal line S/T under the control of the display compensation control end S.

According to the pixel circuit in the embodiments of the present disclosure, the pixel circuit for display (including the pixel driving circuit and the light-emitting element connected to each other) and the photosensitive touch circuit for photosensitive touch (which is configured to receive an optical signal and convert it into the corresponding touch sensing current signal) are optimized and integrated. Through changing a manufacture process, it is able to provide the pixel circuit with two functions using one back plate taping-out process, thereby to provide an Active- Matrix Organic Light-Emitting Diode (AMOLED) built-in touch function in an integrated manner.

In the embodiments of the present disclosure, a photosensitive detection circuit may be integrated into the pixel circuit with an external compensation function, and an external compensation signal line may be multiplexed as a photoelectric touch feedback signal line (i.e., the touch display signal line).

Currently, it is impossible for the pixel circuit with the external compensation function to achieve real-time compensation in synchronization with the display. An operation procedure of a conventional pixel circuit with the external compensation function will be described hereinafter. At first, external compensation is performed so as to extract compensation information (i.e., threshold voltage information about the driving transistor), then the compensation information is fed back to the external source electrode driver, and then a normal display operation is performed. During the normal display operation, the touch display signal line for extracting a compensation signal is always in an idle state. In the embodiments of the present disclosure, the touch display signal line in the idle state may be used to achieve a touch function, so the display function and the touch function may be achieved synchronously, and a display time period may not be occupied by a touch operation.

Figure 2:
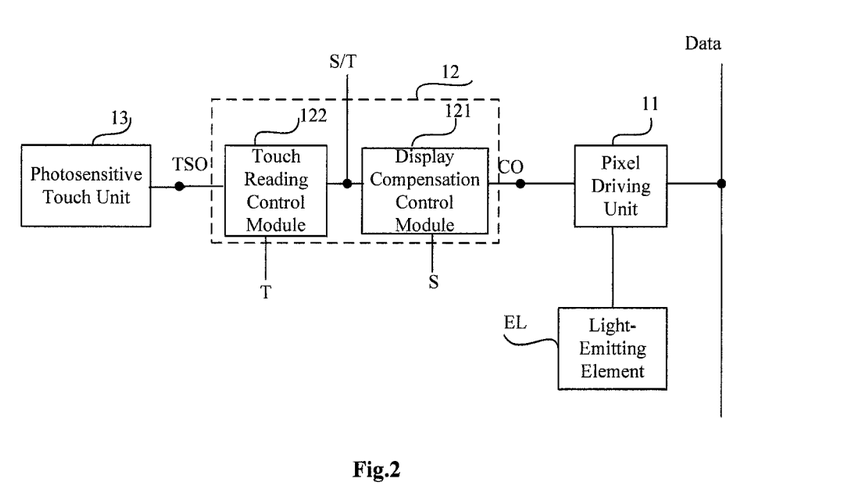
FIG. 2 is another schematic view showing the pixel circuit according to one embodiment of the present disclosure.

In a possible embodiment of the present disclosure, as shown in FIG. 2, the control circuit 12 may include a display compensation control module 121 and a touch reading control module 122. The display compensation control module 121 is connected to the compensation signal output end CO, the display compensation control end S and the touch display signal line S/T, and configured to control the compensation signal output end CO to be electrically connected to the touch display signal line S/T at a display compensation stage and control the compensation signal output end CO not to be electrically connected to the touch display signal line S/T at a display stage under the control of the display compensation control end S. The touch reading control module 122 is connected to the touch sensing current signal output end TSO, the touch reading control end T and the touch display signal line S/T, and configured to control the touch sensing current signal output end TSO not to be electrically connected to the touch display signal line S/T at the display compensation stage and control the touch sensing current signal output end TSO to be electrically connected to the touch display signal line S/T at the display stage under the control of the touch reading control end T.

In actual use, the display compensation control module is configured to control a display compensation operation, and the touch reading control module is configured to control a touch reading operation.

To be specific, the display compensation control module may include a display compensation control transistor, a gate electrode of which is connected to the display compensation control end, a first electrode of which is connected to the touch display signal line, and a second electrode of which is connected to the compensation signal output end. The touch reading control module may include a touch reading control transistor, a gate electrode of which is connected to the touch reading control end, a first electrode of which is connected to the touch sensing current signal output end, and a second electrode of which is connected to the touch display signal line.

In a possible embodiment of the present disclosure, the photosensitive touch circuit may include a photosensitive transistor, a touch capacitor circuit and a touch transistor. A gate electrode of the photosensitive transistor is connected to a photosensitive resetting control end, a first electrode thereof is connected to a first end of a touch capacitor circuit, and a second electrode of which is connected to a photosensitive resetting signal input end. A second end of the touch capacitor circuit is connected to a first level input end. A gate electrode of the touch transistor is connected to the first electrode of the photosensitive transistor, a first electrode thereof is connected to the first level input end, and a second electrode thereof is connected to the touch sensing current signal output end.

In actual use, the display compensation stage includes a resetting sub-stage and a photosensing sub-stage.

At the resetting sub-stage, the photosensitive transistor is turned on under the control of a photosensitive resetting control end, so as to write a photosensitive resetting signal into the touch capacitor circuit via a photosensitive resetting signal input end, thereby to reset a potential at the gate electrode of the touch transistor and turn on the touch transistor. At the photosensing sub-stage, the photosensitive transistor is turned on under the control of the photosensitive resetting control end and receive the light intensity signal, so as to generate a photon-induced carrier and store the photon-induced carrier in the touch capacitor circuit, thereby to change a voltage applied to the gate electrode of the touch transistor, i.e., the touch sensing voltage.

At the display stage, the touch transistor is turned on under the control of the touch sensing voltage, so as to generate a touch sensing current flowing through the touch transistor.

In a possible embodiment of the present disclosure, the pixel driving circuit may include the driving transistor, a display capacitor circuit, a data write-in circuit and a light-emission control circuit. A first end of the display capacitor circuit is connected to a gate electrode of the driving transistor, and a second end thereof is connected to a first electrode of the driving transistor. A second electrode of the driving transistor is connected to the compensation signal output end. The data write-in circuit is connected to the gate electrode of the driving transistor, a corresponding gate line and a corresponding data line, and configured to control whether or not the gate electrode of the driving transistor is to be electrically connected to the corresponding data line under the control of the corresponding gate line. The light-emission control circuit is connected to a light-emission control end, the light-emitting element and the second electrode of the driving transistor, and configured to control whether or not the second electrode of the driving transistor is to be electrically connected to the light-emitting element under the control of the light-emission control end.

To be specific, the data write-in circuit may include a data write-in transistor, and the light-emission control circuit may include a light-emission control transistor. A gate electrode of the data write-in transistor is connected to the corresponding gate line, a first electrode thereof is connected to the gate electrode of the driving transistor, and a second electrode thereof is connected to the corresponding data line. A gate electrode of the light-emission control transistor is connected to the light-emission control end, a first electrode thereof is connected to the light-emitting element, and a second electrode thereof is connected to the second electrode of the driving transistor.

The pixel circuit will be described hereinafter in conjunction with the embodiments.

Figure 3:
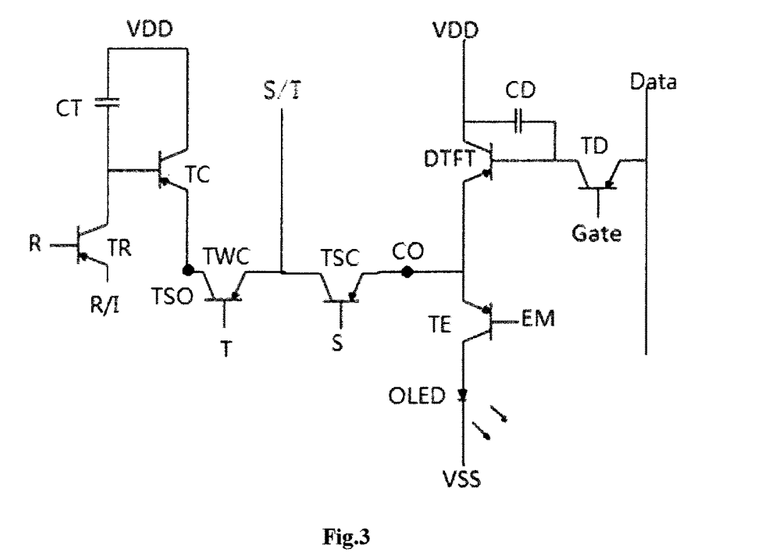
FIG. 3 is yet another schematic view showing the pixel circuit according to one embodiment of the present disclosure.

As shown in FIG. 3, the pixel circuit includes a touch pixel driving sub-circuit and an OLED. The touch pixel driving sub-circuit includes a pixel driving circuit connected to the OLED, a control circuit and a photosensitive touch circuit. The control circuit includes a display compensation control module and a touch reading control module. The display compensation control module includes a display compensation control transistor TSC, a gate electrode of which is connected to the display compensation control end S, a source electrode of which is connected to the touch display signal line S/T, and a drain electrode of which is connected to the compensation signal output end CO.

The touch reading control module includes a touch reading control transistor TWC, a gate electrode of which is connected to the touch reading control end T, a source electrode of which is connected to the touch sensing current signal output end TSO, and a drain electrode of which is connected to the touch display signal line S/T.

The photosensitive touch circuit includes a photosensitive transistor TR, a touch capacitor CT and a touch transistor TC. A gate electrode of the photosensitive transistor TR is connected to the photosensitive resetting control end R, a source electrode thereof is connected to a first end of the touch capacitor CT, and a drain electrode thereof is connected to the photosensitive resetting signal input end R/I. A second end of the touch capacitor CT is connected to a high level input end for inputting a high level VDD. A gate electrode of the touch transistor TC is connected to the source electrode of the photosensitive transistor TR, a source electrode thereof is connected to the high level input end for inputting the high level VDD, and a drain electrode thereof is connected to the touch sensing current signal output end TSO.

The pixel driving circuit includes a driving transistor DTFT, a display capacitor CD, a data write-in circuit and a light-emission control circuit. A first end of the display capacitor CD is connected to a gate electrode of the driving transistor DTFT, and a second end thereof is connected to a source electrode of the driving transistor DTFT. A drain electrode of the driving transistor DTFT is connected to the compensation signal output end CO.

The data write-in circuit includes a data write-in transistor TD, and the light-emission control circuit includes a light-emission control transistor TE. A gate electrode of the data write-in transistor TD is connected to a corresponding gate line Gate, a source electrode thereof is connected to the gate electrode of the driving transistor, and a drain electrode thereof is connected to a corresponding data line Data.

A gate electrode of the light-emission control transistor TE is connected to the light-emission control end EM, a source electrode thereof is connected to an anode of the OLED, and a drain electrode thereof is connected to the drain electrode of the driving transistor DTFT.

A cathode of the OLED is connected to a low level input end for inputting a low level VSS.

In FIG. 3, all the transistors are p-type transistors, and the first level is a high level. However, in actual use, the transistors in the pixel circuit may also be n-type transistors, with a different sequence of the control signals.

Figure 4:
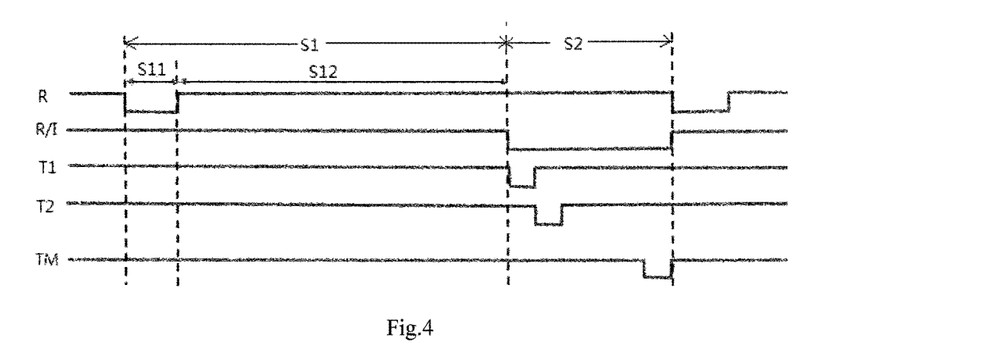
FIG. 4 is a sequence diagram of the pixel circuit in FIG. 3.

As shown in FIG. 4, during the operation of the pixel circuit in FIG. 3, each frame includes the display compensation stage S1 and the display stage S2.

The display compensation stage S1 includes the resetting sub-stage S11 and the photosensing sub-stage S12. The display stage S2 is also called as a touch feedback stage. At the resetting sub-stage S11, a low level is inputted via R, so as to turn on TR and write the photosensitive resetting signal into CT via R/I, thereby to reset a potential at the gate electrode of TC and turn on TR. At the photosensing sub-stage S12, a high level is inputted via R, so as to turn on TR, and enable TR to receive the light intensity signal, generate a photon-induced carrier and store the photon-induced carrier in CT, thereby to change a voltage applied to the gate electrode of TC, i.e., the touch sensing voltage. At the display stage S2, i.e., the touch feedback stage, TC is turned on under the control of the touch sensing voltage, so as to generate the touch sensing current flowing through TC. At the touch feedback stage, TC is turned on, and the touch sensing current flows through TC. A size of the touch sensing current depends on the voltage applied to the gate electrode of TC and VDD. In the case that no touch operation is made, the voltage applied to the gate electrode of TC is a standard voltage and the touch sensing current flowing through TC is a standard current. In the case that a touch operation has been made, due to TR, changes stored in CT may change, and thereby the voltage applied to the gate electrode of TC and the touch sensing current flowing through TC may change too. At this time, it is able to determine a position where the touch operation is made in accordance with the touch sensing current. At the display compensation stage S1, TS is turned on and TT is turned off. At the display stage S2, TS is turned off and TT is turned on.

In actual use, in the case that a display module includes the pixel circuits arranged in M rows and N columns (M and N are each a positive integer), each display stage S2 (i.e., the touch feedback stage) may include M touch sensing signal reading sub-stages. At an $m^{th}$ touch sensing signal reading sub-stage, the corresponding touch reading control transistor is turned on under the control of an $m^{th}$ touch reading control end Tm so as to enable the corresponding touch sensing current signal output end to be electrically connected to the corresponding touch display signal line, and at this time, the photosensitive touch circuit outputs the touch sensing current signal to the touch display signal line via the touch sensing current signal output end, where m is a positive integer smaller than or equal to M.

In FIG. 4, T1 represents a first touch reading control end, T2 represents a second touch reading control end, and TM represents an $M^{th}$ touch reading control end. At the display stage, i.e., a touch sensing signal reading stage, the touch reading control transistors TWC of the pixel circuits at an active display area are turned on sequentially.

As shown in FIG. 4, at a first touch sensing signal reading sub-stage of S2, a low level is inputted to T1, so as to turn on the touch reading control transistor of the pixel circuit in a first row under the control of T1. At a second touch sensing signal reading sub-stage of S2, a low level is inputted to T2, so as to turn on the touch reading control transistor of the pixel circuit in a second row under the control of T2. At an $M^{th}$ touch sensing signal reading sub-stage of S2, a low level is inputted to TM, so as to turn on the touch reading control transistor of the pixel circuit in an $M^{th}$ row under the control of TM.

The present disclosure further provides in some embodiments a method for driving the above-mentioned pixel circuit. The pixel circuit is included in a display module, and the display module includes pixel circuits arranged in M rows, where M is a positive integer greater than 1. Each display period includes a display compensation stage and a display stage. Each display stage includes M touch sensing signal reading sub-stages. In the case that the pixel circuit is located in an $m^{th}$ row, the method includes steps of: at the display compensation stage within each display period, generating, by a photosensitive touch circuit, a corresponding touch sensing voltage in accordance with a received light intensity signal, and controlling, by a control circuit, a touch sensing current signal output end not to be electrically connected to a touch display signal line under the control of a corresponding touch reading control end; and at an $m^{th}$ touch sensing signal reading sub-stage of the display stage, converting, by the photosensitive touch circuit, the touch sensing voltage into a touch sensing current signal, controlling, by the control circuit, the touch sensing current signal output end to be electrically connected to the touch display signal line under the control of the corresponding touch reading control end, and outputting, by the photosensitive touch circuit, the touch sensing current signal to the touch display signal line via the touch sensing current signal output end, where m is a positive integer smaller than or greater than M.

According to the method in the embodiments of the present disclosure, at the corresponding touch sensing signal reading sub-stage of the display stage where the touch display signal line is not used by the pixel driving circuit, the photosensitive touch circuit may convert the touch sensing voltage generated in accordance with the light intensity signal at the display compensation stage into the touch sensing current, and then the touch circuit controls the touch sensing current signal output end to be electrically connected to the touch display signal line under the control of the corresponding touch reading control end. As a result, it is able for the photosensitive touch circuit to output the touch sensing current signal to the touch display signal line via the touch sensing current signal output end, thereby to achieve the touch function and the display function synchronously.

To be specific, the method may further include: for each display period at the display compensation stage, extracting, by a pixel driving circuit, a threshold voltage signal of a driving transistor, controlling, by the control circuit, a compensation signal output end to be electrically connected to the touch display signal line under the control of the display compensation control end, and outputting, by the pixel driving circuit, the threshold voltage signal to the touch display signal line via the compensation signal output end; and at the display stage, controlling, by the control circuit, the compensation signal output end not to be electrically connected to the touch display signal line under the control of the display compensation control end.

In a possible embodiment of the present disclosure, the display compensation stage includes a resetting sub-stage and a photosensing sub-stage. In the case that the photosensitive touch circuit includes a photosensitive transistor, a touch capacitor circuit and a touch transistor, the step of generating, by the photosensitive touch circuit, the corresponding touch sensing voltage in accordance with the received light intensity signal at the display compensation stage includes: at the resetting sub-stage, turning on the photosensitive transistor under the control of a photosensitive resetting control end, so as to write a photosensitive resetting signal into the touch capacitor circuit via a photosensitive resetting signal input end, thereby to reset a potential at a gate electrode of the touch transistor and turn on the touch transistor; and at the photosensing sub-stage, turning the photosensitive transistor under the control of the photosensitive resetting control end, so as to enable the photosensitive transistor to receive the light intensity signal to generate a photo-induced carrier and store the photo-induced carrier in the touch capacitor circuit, thereby to change a voltage applied to the gate electrode of the touch transistor, i.e., the touch sensing voltage. The step of converting, by the photosensitive touch circuit, the touch sensing voltage into the touch sensing current signal at the display stage includes, at the display stage, turning on the touch transistor under the control of the touch sensing voltage, so as to generate a touch sensing current flowing through the touch transistor.

The present disclosure further provides in some embodiments a display module, including the above-mentioned pixel circuits arranged in M rows and N columns, and touch display signal lines arranged in N columns. Control circuits of touch pixel driving sub-circuits of the pixel circuits in each row and an $n^{th}$ column are connected to an $n^{th}$ touch display signal line, where M is an integer greater than 1, N is an integer greater than 1, and n is a positive integer smaller than or equal to N.

In a possible embodiment of the present disclosure, the display module further includes data lines arranged in N columns, a switching circuit, a source electrode driving circuit, a touch sensing circuit and a display compensation circuit, where N is a positive integer greater than 1. The source electrode driving circuit is connected to the N data lines. The switching circuit includes N switching modules. The touch sensing circuit and the display compensation circuit are each connected to the N switching modules. An $n^{th}$ switching module includes an $n^{th}$ touch switching sub-module and an $n^{th}$ display compensation switching sub-module, where n is a positive integer smaller than or equal to N. An $n^{th}$ touch display signal line is connected to the touch sensing circuit via the $n^{th}$ touch switching sub-module. A control end of the nth touch switching sub-module is connected to an $n^{th}$ touch switching control end. The $n^{th}$ touch switching sub-module is configured to control whether or not the $n^{th}$ touch display signal line is to be electrically connected to the touch sensing circuit under the control of the $n^{th}$ touch switching control end. The $n^{th}$ touch display signal line is connected to the display compensation circuit via the $n^{th}$ display compensation switching sub-module. A control end of the $n^{th}$ display compensation switching sub-module is connected to an $n^{th}$ display compensation switching control end. The $n^{th}$ display compensation switching sub-module is configured to control whether or not the $n^{th}$ touch display signal line is to be electrically connected to the display compensation circuit under the control of the $n^{th}$ display compensation switching control end.

To be specific, the $n^{th}$ touch switching sub-module includes an $n^{th}$ touch switching transistor, a gate electrode of which is connected to the $n^{th}$ touch switching control end, a first electrode of which is connected to the touch sensing circuit, and a second electrode of which is connected to the $n^{th}$ touch display signal line. The $n^{th}$ display compensation switching sub-module includes an $n^{th}$ display compensation switching transistor, a gate electrode of which is connected to the $n^{th}$ display compensation switching control end, a first electrode of which is connected to the display compensation circuit, and a second electrode of which is connected to the $n^{th}$ touch display signal line.

The display module will be described hereinafter in conjunction with the embodiments.

Figure 5:
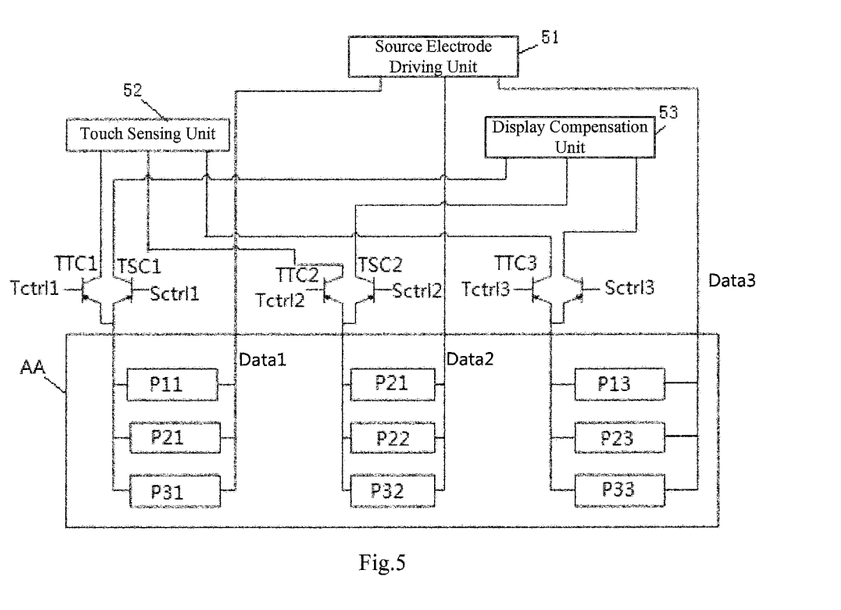
FIG. 5 is a circuit diagram of a display module according to one embodiment of the present disclosure.

As shown in FIG. 5, P11 represents the pixel circuit in a first row and a first column, P21 represents the pixel circuit in a second row and the first column, P31 represents the pixel circuit in a third row and the first column, P12 represents the pixel circuit in the first row and a second column, P22 represents the pixel circuit in the second row and the second column, P32 represents the pixel circuit in the third row and the second column, P13 represents the pixel circuit in the first row and a third column, P23 represents the pixel circuit in the second row and the third column, and P33 represents the pixel circuit in the third row and the third column.

The display module further includes a first data line Data1, a second data line Data2, a third data line Data3, a switching circuit, a source electrode driving circuit 51, a touch sensing circuit 52 and a display compensation circuit 53. The source electrode driving circuit 51 is connected to the first data line Data1, the second data line Data2 and the third data line Data3. The switching circuit includes three switching modules, to which the touch sensing circuit 52 and the display compensation circuit 53 are connected.

The first switching module includes a first touch switching transistor TTC1 and a first display compensation switching transistor TSC1. A gate electrode of the first touch switching transistor TTC1 is connected to a first touch switching control end Tctrl1, a source electrode thereof is connected to the touch sensing circuit 52, and a drain electrode thereof is connected to a first touch display signal line S/T-1. A gate electrode of the first display compensation switching transistor TSC1 is connected to a first display compensation switching control end Sctrl1, a source electrode thereof is connected to the display compensation circuit 53, and a drain electrode thereof is connected to the first touch display signal line S/T-1.

The second switching module includes a second touch switching transistor TTC2 and a second display compensation switching transistor TSC2. A gate electrode of the second touch switching transistor TTC2 is connected to a second touch switching control end Tctrl2, a source electrode thereof is connected to the touch sensing circuit 52, and a drain electrode thereof is connected to a second touch display signal line S/T-2. A gate electrode of the second display compensation switching transistor TSC2 is connected to a second display compensation switching control end Sctrl2, a source electrode thereof is connected to the display compensation circuit 53, and a drain electrode thereof is connected to the second touch display signal line S/T-2.

The third switching module includes a third touch switching transistor TTC3 and a third display compensation switching transistor TSC3. A gate electrode of the third touch switching transistor TTC3 is connected to a third touch switching control end Tctrl3, a source electrode thereof is connected to the touch sensing circuit 52, and a drain electrode thereof is connected to a third touch display signal line S/T-3. A gate electrode of the third display compensation switching transistor TSC3 is connected to a third display compensation switching control end Sctrl3, a source electrode thereof is connected to the display compensation circuit 53, and a drain electrode thereof is connected to the third touch display signal line S/T-3.

P11, P21 and P31 are connected to Data1, P12, P22 and P32 are connected to Data2, and P13, P23 and P33 are connected to Data3.

In FIG. 5, AA represents the active display area.

In the embodiment as shown in FIG. 5, the pixel circuits arranged in three rows and three columns are taken as an example. Each pixel circuit may have a structure as shown in FIG. 3.

In the embodiment as shown in FIG. 5, TTC1, TSC1, TTC2, TSC2, TTC3 and TSC3 are p-type transistors. However, in actual use, the transistors may also be n-type transistors, merely with a different sequence of the control signals.

According to the display module in FIG. 5, the switching modules for controlling the touch display signal lines S/T are arranged outside the display area, and each switching module includes the switching transistors for achieving the external display compensation function and the touch function respectively. Each touch switching transistor is configured to feed back a signal from the corresponding touch display signal line to the touch sensing circuit 52 at the display stage S2, so as to achieve the touch function. Each display compensation switching transistor is configured to feed back the threshold voltage signal from the corresponding touch display signal line to the display compensation circuit 53 at the display compensation stage S1, so as to achieve the external display compensation function. During the external display compensation, each touch switching transistor is in an off state, and each display compensation switching transistor is in an on state. During a normal display operation, each touch switching transistor is in the on state, and each display compensation switching transistor is in the off state. In this way, it is able to achieve the touch function and the display function synchronously.

The present disclosure further provides in some embodiments a method for driving the above-mentioned display module. Each display period includes a display compensation stage and a display stage. The method includes steps of: at the display compensation of each display period, controlling, by an $n^{th}$ display compensation switching sub-module, an $n^{th}$ touch display signal line to be electrically connected to a display compensation circuit under the control of an $n^{th}$ display compensation switching control end, and controlling, by an $n^{th}$ touch switching sub-module, the nth touch display signal line not to be electrically connected to a touch sensing circuit under the control of an $n^{th}$ touch switching control end; and at the display stage, controlling, by the $n^{th}$ display compensation switching sub-module, the $n^{th}$ touch display signal line not to be electrically connected to the display compensation circuit under the control of the $n^{th}$ display compensation switching control end, and controlling, by the $n^{th}$ touch switching sub-module, the $n^{th}$ touch display signal line to be electrically connected to the touch sensing circuit under the control of the $n^{th}$ touch switching control end.

The present disclosure further provides in some embodiments a method for manufacturing the above-mentioned display module. In the case that a photosensitive touch circuit of pixel circuit included in the display module includes a photosensitive transistor, the method includes steps of: forming the photosensitive transistor at a photosensitive region of a display substrate, and forming transistors of the pixel circuit other than the photosensitive transistor at a light-emission region of the display substrate, the photosensitive region being spaced apart from the light-emission region; forming a planarization layer; and forming an anode, a pixel definition layer, an organic light-emission layer and a cathode sequentially on the planarization layer. The anode is arranged in such a manner as not to shield the photosensitive transistor and shield the transistors of the pixel circuit other than the photosensitive transistor.

In a possible embodiment of the present disclosure, the photosensitive region and the light-emission region are spaced apart from each other on the display substrate.

The manufacture procedure of the display module will be described hereinafter in more details.

Figure 6:
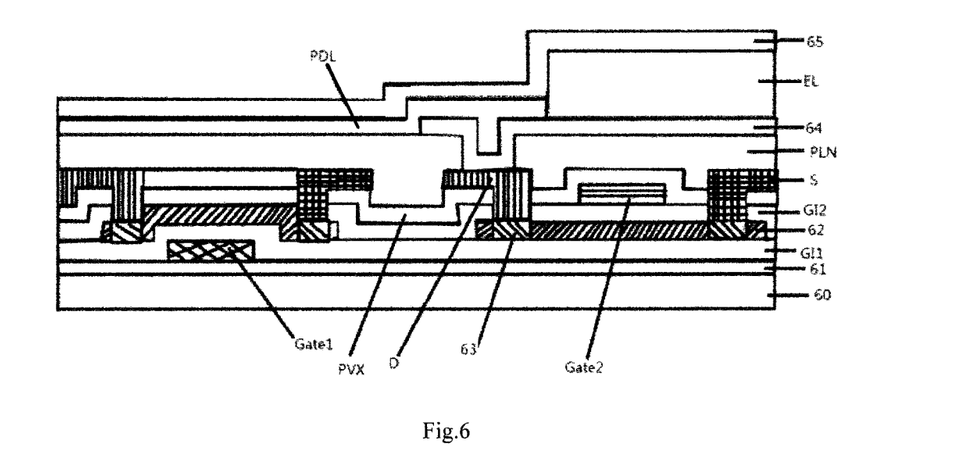
FIG. 6 is a schematic view showing the display module according to one embodiment of the present disclosure.

At first, a buffer layer 61 may be deposited onto a substrate 60 (which may be made of glass or any other materials), and a first gate metal layer Gate1 may be deposited onto the buffer layer 61 for the formation of a pattern of the gate electrode of the photosensitive transistor. Then, a Gate1 pattern may be formed through coating, exposing, developing, etching and removing a photoresist (PR).

Next, a first insulation layer GI1 may be deposited, and an amorphous silicon (a-Si) layer may be deposited onto the first insulation layer GI1 The a-Si layer may be crystallized through a low temperature crystallization process. A poly-Si pattern may be formed through coating, exposing, developing, etching and removing the photoresist, so as to form an active layer 62.

Next, a second insulation layer GI2 may be deposited, and a second gate metal layer Gate2 may be deposited onto the second insulation layer GI2 for the formation of gate electrodes of the transistors other than the photosensitive transistor. A Gate2 pattern may be formed through coating, exposing, developing, etching and removing the photoresist.

Next, a third insulation layer PVX (i.e., a passivation layer) may be deposited, and the photoresist may be coated thereon. Then, through a mask with a via-hole at a position corresponding to a source/drain region of the transistor, a source/drain contact region of the transistor, after the exposing and developing processes at the source/drain region, may be subjected to n-doping treatment, so as to form an n-doped region 63. A channel region of the photosensitive transistor may be shielded by the photoresist, so it may not be adversely affected by the n-doping treatment. Channel regions of the other transistors may also be shielded by the photoresist. Then, the via-hole may be formed in the passivation layer through etching and removing the photoresist.

Next, a source/drain metal layer may be deposited mainly at the source/drain region of the transistor, so as to form metal electrodes. SD patterns may be formed through coating, exposing, developing, etching and removing the photoresist (S represents the source electrode and the D represents the drain electrode).

Next, a fourth insulation layer PLN (i.e., a planarization layer) may be deposited. The fourth insulation layer is made of an organic photosensitive material, so it is able to acquire a PLN pattern merely through exposing and developing.

Next, a nontransparent, high-reflective OLED anodic electrode 64 may be formed. As an anode of the top-emission OLED, the anodic electrode 64 may also be used to shield the transistors thereunder from the external light. This electrode may not be formed above the photosensitive transistor, so a channel region of S3 may receive the external light.

Finally, a pattern of a pixel definition layer (PDL) may be formed, and a light-emission layer (EL) may be formed at a pixel region defined by the pixel definition layer, so as to form a planar, transparent metal cathode 65.

The present disclosure further provides in some embodiments a display device including the above-mentioned display module. The display device may be any product or member having a display function, such as OLED display panel, mobile phone, flat-panel computer, television, display, laptop computer, digital photo frame or navigator.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A pixel circuit, comprising a touch pixel driving sub-circuit and a light-emitting element, wherein the touch pixel driving sub-circuit comprises a pixel driving circuit connected to the light-emitting element;
   the pixel driving circuit is connected to an external source electrode driver via a corresponding data line and configured to extract a threshold voltage signal of a driving transistor, and output the threshold voltage signal via a compensation signal output end;
   the touch pixel driving sub-circuit further comprises a control circuit and a photosensitive touch circuit;
   the photosensitive touch circuit is configured to generate a corresponding touch sensing current signal in accordance with a received light intensity signal, and output the touch sensing current signal via a touch sensing current signal output end; and
   the control circuit is connected to the compensation signal output end of the pixel driving circuit, the touch sensing current signal output end of the photosensitive touch circuit, a display compensation control end, a touch reading control end and a touch display signal line, and configured to control whether or not the touch sensing current signal output end is to be electrically connected to the touch display signal line under the control of the touch reading control end, and control whether or not the compensation signal output end is to be electrically connected to the touch display signal line under the control of the display compensation control end.

2. The pixel circuit according to claim 1, wherein the control circuit comprises a display compensation control module and a touch reading control module;
   the display compensation control module is connected to the compensation signal output end, the display compensation control end and the touch display signal line, and configured to control the compensation signal output end to be electrically connected to the touch display signal line at a display compensation stage and control the compensation signal output end not to be electrically connected to the touch display signal line at a display stage under the control of the display compensation control end; and
   the touch reading control module is connected to the touch sensing current signal output end, the touch reading control end and the touch display signal line, and configured to control the touch sensing current signal output end not to be electrically connected to the touch display signal line at the display compensation stage and control the touch sensing current signal output end to be electrically connected to the touch display signal line at the display stage, under the control of the touch reading control end.

3. The pixel circuit according to claim 2, wherein the display compensation control module comprises a display compensation control transistor, a gate electrode of which is connected to the display compensation control end, a first electrode of which is connected to the touch display signal line, and a second electrode of which is connected to the compensation signal output end; and
   the touch reading control module comprises a touch reading control transistor, a gate electrode of which is connected to the touch reading control end, a first electrode of which is connected to the touch sensing current signal output end, and a second electrode of which is connected to the touch display signal line.

4. The pixel circuit according to claim 1, wherein the photosensitive touch circuit comprises a photosensitive transistor, a touch capacitor circuit and a touch transistor;
   a gate electrode of the photosensitive transistor is connected to a photosensitive resetting control end, a first electrode of the photosensitive transistor is connected to a first end of a touch capacitor circuit, and a second electrode of the photosensitive transistor is connected to a photosensitive resetting signal input end;

a second end of the touch capacitor circuit is connected to a first level input end; and a gate electrode of the touch transistor is connected to the first electrode of the photosensitive transistor, a first electrode of the touch transistor is connected to the first level input end, and a second electrode of the touch transistor is connected to the touch sensing current signal output end.

5. The pixel circuit according to claim 1, wherein the pixel driving circuit comprises the driving transistor, a display capacitor circuit, a data write-in circuit and a light-emission control circuit;

a first end of the display capacitor circuit is connected to a gate electrode of the driving transistor, and a second end of the display capacitor circuit is connected to a first electrode of the driving transistor;

a second electrode of the driving transistor is connected to the compensation signal output end;

the data write-in circuit is connected to the gate electrode of the driving transistor, a corresponding gate line and a corresponding data line, and configured to control whether or not the gate electrode of the driving transistor is to be electrically connected to the corresponding data line under the control of the corresponding gate line; and the light-emission control circuit is connected to a light-emission control end, the light-emitting element and the second electrode of the driving transistor, and configured to control whether or not the second electrode of the driving transistor is to be electrically connected to the light-emitting element under the control of the light-emission control end.

6. The pixel circuit according to claim 5, wherein the data write-in circuit comprises a data write-in transistor, and the light-emission control circuit comprises a light-emission control transistor;

a gate electrode of the data write-in transistor is connected to the corresponding gate line, a first electrode of the data write-in transistor is connected to the gate electrode of the driving transistor, and a second electrode of the data write-in transistor is connected to the corresponding data line; and a gate electrode of the light-emission control transistor is connected to the light-emission control end, a first electrode of the light-emission control transistor is connected to the light-emitting element, and a second electrode of the light-emission control transistor is connected to the second electrode of the driving transistor.

7. The pixel circuit according to claim 2, wherein the photosensitive touch circuit comprises a photosensitive transistor, a touch capacitor circuit and a touch transistor;

a gate electrode of the photosensitive transistor is connected to a photosensitive resetting control end, a first electrode of the photosensitive transistor is connected to a first end of a touch capacitor circuit, and a second electrode of the photosensitive transistor is connected to a photosensitive resetting signal input end;

a second end of the touch capacitor circuit is connected to a first level input end; and a gate electrode of the touch transistor is connected to the first electrode of the photosensitive transistor, a first electrode of the touch transistor is connected to the first level input end, and a second electrode of the touch transistor is connected to the touch sensing current signal output end.

8. The pixel circuit according to claim 2, wherein the pixel driving circuit comprises the driving transistor, a display capacitor circuit, a data write-in circuit and a light-emission control circuit;

a first end of the display capacitor circuit is connected to a gate electrode of the driving transistor, and a second end of the display capacitor circuit is connected to a first electrode of the driving transistor;

a second electrode of the driving transistor is connected to the compensation signal output end;

the data write-in circuit is connected to the gate electrode of the driving transistor, a corresponding gate line and a corresponding data line, and configured to control whether or not the gate electrode of the driving transistor is to be electrically connected to the corresponding data line under the control of the corresponding gate line; and the light-emission control circuit is connected to a light-emission control end, the light-emitting element and the second electrode of the driving transistor, and configured to control whether or not the second electrode of the driving transistor is to be electrically connected to the light-emitting element under the control of the light-emission control end.

9. The pixel circuit according to claim 8, wherein the data write-in circuit comprises a data write-in transistor, and the light-emission control circuit comprises a light-emission control transistor;

a gate electrode of the data write-in transistor is connected to the corresponding gate line, a first electrode of the data write-in transistor is connected to the gate electrode of the driving transistor, and a second electrode of the data write-in transistor is connected to the corresponding data line; and a gate electrode of the light-emission control transistor is connected to the light-emission control end, a first electrode thereof is connected to the light-emitting element, and a second electrode thereof is connected to the second electrode of the driving transistor.

10. The pixel circuit according to claim 3, wherein the photosensitive touch circuit comprises a photosensitive transistor, a touch capacitor circuit and a touch transistor;

a gate electrode of the photosensitive transistor is connected to a photosensitive resetting control end, a first electrode of the photosensitive transistor is connected to a first end of a touch capacitor circuit, and a second electrode of the photosensitive transistor is connected to a photosensitive resetting signal input end;

a second end of the touch capacitor circuit is connected to a first level input end; and a gate electrode of the touch transistor is connected to the first electrode of the photosensitive transistor, a first electrode of the touch transistor is connected to the first level input end, and a second electrode of the touch transistor is connected to the touch sensing current signal output end.

11. The pixel circuit according to claim 3, wherein the pixel driving circuit comprises the driving transistor, a display capacitor circuit, a data write-in circuit and a light-emission control circuit;

a first end of the display capacitor circuit is connected to a gate electrode of the driving transistor, and a second end of the display capacitor circuit is connected to a first electrode of the driving transistor;

a second electrode of the driving transistor is connected to the compensation signal output end;

the data write-in circuit is connected to the gate electrode of the driving transistor, a corresponding gate line and a corresponding data line, and configured to control whether or not the gate electrode of the driving transistor is to be electrically connected to the corresponding data line under the control of the corresponding gate line; and the light-emission control circuit is connected to a light-emission control end, the light-emitting element and the second electrode of the driving transistor, and configured to control whether or not the second electrode of the driving transistor is to be electrically connected to the light-emitting element under the control of the light-emission control end.

12. A method for driving a display module, wherein the display module comprises the pixel circuits according to claim 1 arranged in M rows, M is a positive integer greater than 1, each display period comprises a display compensation stage and a display stage, each display stage comprises M touch sensing signal reading sub-stages, wherein in the case that the pixel circuit is located in an $m^{th}$ row, the method comprises steps of: within each display period, at the display compensation stage, generating, by a photosensitive touch circuit, a corresponding touch sensing voltage in accordance with a received light intensity signal, and controlling, by a control circuit, a touch sensing current signal output end not to be electrically connected to a touch display signal line under the control of a corresponding touch reading control end; and at an $m^{th}$ touch sensing signal reading sub-stage of the display stage, converting, by the photosensitive touch circuit, a touch sensing voltage into a touch sensing current signal, controlling, by the control circuit, the touch sensing current signal output end to be electrically connected to the touch display signal line under the control of the corresponding touch reading control end, and outputting, by the photosensitive touch circuit, the touch sensing current signal to the touch display signal line via the touch sensing current signal output end, where m is a positive integer smaller than or equal to than M.

13. The method according to claim 12, further comprising: within each display period, at the display compensation stage, extracting, by a pixel driving circuit, a threshold voltage signal of a driving transistor of the pixel driving circuit, controlling, by the control circuit, a compensation signal output end to be electrically connected to the touch display signal line under the control of the display compensation control end, and outputting, by the pixel driving circuit, the threshold voltage signal to the touch display signal line via the compensation signal output end; and at the display stage, controlling, by the control circuit, the compensation signal output end not to be electrically connected to the touch display signal line under the control of the display compensation control end.

14. The method according to claim 12, wherein the display compensation stage comprises a resetting sub-stage and a photosensing sub-stage, and the photosensitive touch circuit comprises a photosensitive transistor, a touch capacitor circuit and a touch transistor, wherein the step of generating, by the photosensitive touch circuit, the corresponding touch sensing voltage in accordance with the received light intensity signal at the display compensation stage comprises:

at the resetting sub-stage, turning on the photosensitive transistor under the control of a photosensitive resetting control end, to write a photosensitive resetting signal into the touch capacitor circuit via a photosensitive resetting signal input end, and resetting a potential at a gate electrode of the touch transistor and turning on the touch transistor; and at the photosensing sub-stage, turning the photosensitive transistor under the control of the photosensitive resetting control end, to enable the photosensitive transistor to receive the light intensity signal to generate a photo-induced carrier and store the photo-induced carrier in the touch capacitor circuit, to change a voltage applied to the gate electrode of the touch transistor, i.e., a touch sensing voltage, wherein the step of converting, by the photosensitive touch circuit, the touch sensing voltage into the touch sensing current signal at the display stage comprises, at the display stage, turning on the touch transistor under the control of the touch sensing voltage, to generate a touch sensing current flowing through the touch transistor.

15. A display module, comprising the pixel circuits according to claim 1 arranged in M rows and N columns and touch display signal lines arranged in N columns, wherein control circuits of touch pixel driving sub-circuits of the pixel circuits in each row and an $n^{th}$ column are connected to an $n^{th}$ touch display signal line, where M is an integer greater than 1, N is an integer greater than 1, and n is a positive integer smaller than or equal to N.

16. The display module according to claim 15, further comprising data lines arranged in N columns, a switching circuit, a source electrode driving circuit, a touch sensing circuit and a display compensation circuit, where N is a positive integer greater than 1;

the source electrode driving circuit is connected to the N data lines;

the switching circuit comprises N switching modules;

the touch sensing circuit and the display compensation circuit are each connected to the N switching modules;

an $n^{th}$ switching module comprises an $n^{th}$ touch switching sub-module and an $n^{th}$ display compensation switching sub-module, where n is a positive integer smaller than or equal to N;

an $n^{th}$ touch display signal line is connected to the touch sensing circuit via the $n^{th}$ touch switching sub-module;

a control end of the $n^{th}$ touch switching sub-module is connected to an $n^{th}$ touch switching control end;

the $n^{th}$ touch switching sub-module is configured to control whether or not the $n^{th}$ touch display signal line is to be electrically connected to the touch sensing circuit under the control of the $n^{th}$ touch switching control end;

the $n^{th}$ touch display signal line is connected to the display compensation circuit via the $n^{th}$ display compensation switching sub-module;

a control end of the $n^{th}$ display compensation switching sub-module is connected to an $n^{th}$ display compensation switching control end; and the $n^{th}$ display compensation switching sub-module is configured to control whether or not the $n^{th}$ touch display signal line is to be electrically connected to the display compensation circuit under the control of the $n^{th}$ display compensation switching control end.

17. The display module according to claim 16, wherein the $n^{th}$ touch switching sub-module comprises an $n^{th}$ touch switching transistor, a gate electrode of which is connected to the $n^{th}$ touch switching control end, a first electrode of which is connected to the touch sensing circuit, and a second electrode of which is connected to the $n^{th}$ touch display signal line; and the $n^{th}$ display compensation switching sub-module comprises an $n^{th}$ display compensation switching transistor, a gate electrode of which is connected to the $n^{th}$ display compensation switching control end, a first electrode of which is connected to the display compensation circuit, and a second electrode of which is connected to the $n^{th}$ touch display signal line.

18. A method for driving the display module according to claim 16, wherein each display period comprises a display compensation stage and a display stage, wherein the method comprises: within each display period, at the display compensation, controlling, by an $n^{th}$ display compensation switching sub-module, an $n^{th}$ touch display signal line to be electrically connected to a display compensation circuit under the control of an $n^{th}$ display compensation switching control end, and controlling, by an $n^{th}$ touch switching sub-module, the $n^{th}$ touch display signal line not to be electrically connected to a touch sensing circuit under the control of an $n^{th}$ touch switching control end; and at the display stage, controlling, by the $n^{th}$ display compensation switching sub-module, the $n^{th}$ touch display signal line not to be electrically connected to the display compensation circuit under the control of the $n^{th}$ display compensation switching control end, and controlling, by the $n^{th}$ touch switching sub-module, the $n^{th}$ touch display signal line to be electrically connected to the touch sensing circuit under the control of the $n^{th}$ touch switching control end.

19. A method for manufacturing the display module according to claim 15, wherein a photosensitive touch circuit of pixel circuit comprised in the display module comprises a photosensitive transistor, wherein the method comprises:

forming the photosensitive transistor at a photosensitive region of a display substrate, and forming transistors of the pixel circuit other than the photosensitive transistor at a light-emission region of the display substrate, the photosensitive region being spaced apart from the light-emission region;

forming a planarization layer; and forming an anode, a pixel definition layer, an organic light-emission layer and a cathode sequentially on the planarization layer, wherein the anode is arranged in such a manner as not to shield the photosensitive transistor and shield the transistors of the pixel circuit other than the photosensitive transistor.

20. A display device, comprising the display module according to claim 15.

* * * * *